United States Patent [19]

Ashby et al.

[11] Patent Number: 4,880,493

[45] Date of Patent: Nov. 14, 1989

[54] ELECTRONIC-CARRIER-CONTROLLED PHOTOCHEMICAL ETCHING PROCESS IN SEMICONDUCTOR DEVICE FABRICATION

[75] Inventors: Carol I. H. Ashby, Edgewood; David R. Myers; Frederick L. Vook, both of Albuquerque, all of N. Mex.

[73] Assignee: The United States of America as represented by the United States Department of Energy, Washington, D.C.

[21] Appl. No.: 207,487

[22] Filed: Jun. 16, 1988

[51] Int. Cl.$^4$ .................... H01L 21/306; B44C 1/22
[52] U.S. Cl. ............................... 156/628; 156/643; 156/646; 156/654; 156/655; 156/657; 156/662; 437/234
[58] Field of Search ............... 156/628, 643, 646, 654, 156/655, 657, 662; 437/225, 233, 234

[56] References Cited

U.S. PATENT DOCUMENTS

| | | | |
|---|---|---|---|
| 4,377,437 | 3/1983 | Taylor et al. | 156/628 |
| 4,377,734 | 3/1983 | Mashiko et al. | 219/121 |
| 4,438,556 | 3/1984 | Komatsu et al. | 29/576 B |
| 4,450,041 | 5/1984 | Aklufi | 156/628 |
| 4,569,124 | 2/1986 | Rensch et al. | 29/591 |
| 4,601,778 | 7/1986 | Robb | 156/628 |

OTHER PUBLICATIONS

A. Yamamoto et al., "Anodic Dissolution of N-Type Gallium Arsenide Under Illumination", *J. Electrochemical Society: Solid-State Science and Technology*, vol. 122, No. 2, Feb. 75, pp. 260–267.

C. Ashby, "Photochemical Dry Etching of GaAs", *Applied Physics Letters*, vol. 45, No. 8, Oct. 15, 1984, pp. 892–894.

*Primary Examiner*—William A. Powell
*Attorney, Agent, or Firm*—Armand McMillan; James H. Chafin; Judson R. Hightower

[57] ABSTRACT

An electronic-carrier-controlled photochemical etching process for carrying out patterning and selective removing of material in semiconductor device fabrication includes the steps of selective ion implanting, photochemical dry etching, and thermal annealing, in that order. In the selective ion implanting step, regions of the semiconductor material in a desired pattern are damaged and the remainder of the regions of the material not implanted are left undamaged. The rate of recombination of electrons and holes is increased in the damaged regions of the pattern compared to undamaged regions. In the photochemical dry etching step which follows ion implanting step, the material in the undamaged regions of the semiconductor are removed substantially faster than in the damaged regions representing the pattern, leaving the ion-implanted, damaged regions as raised surface structures on the semiconductor material. After completion of photochemical dry etching step, the thermal annealing step is used to restore the electrical conductivity of the damaged regions of the semiconductor material.

14 Claims, 1 Drawing Sheet

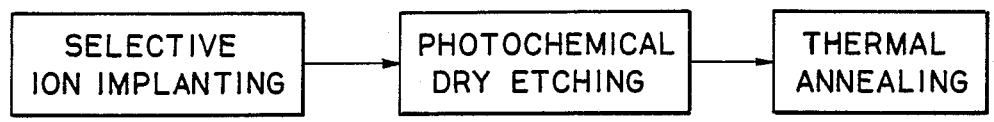

ELECTRONIC-CARRIER-CONTROLLED PHOTOCHEMICAL ETCHING PROCESS IN SEMICONDUCTOR DEVICE FABRICATION

BACKGROUND OF THE INVENTION

1. Field of the Invention

The present invention relates generally to semiconductor device fabrication and, more particularly, to an electronic-carrier-controlled photochemical etching process for patterning and selectively removing material in semiconductor device fabrication. The Government has rights in this invention pursuant to Contract No. DE-AC04-76DP00789 awarded by the U.S. Department of Energy.

1. Description of the Prior Art

The fabrication of a semiconductor integrated circuit device conventionally includes a number of major processing stages, such as film formation, impurity doping, photolithography and etching. Also, a complete fabrication sequence usually requires a number of cycles through each of these processing stages.

Photolithograpy itself typically involves performance of a series of steps for transferring desired geometric shapes from a mask to the surface of a semiconductor wafer. More particularly, in a typical photolithographic transfer process, a photosensitive polymer film is applied to the semiconductor wafer, such as a wafer composed of pure silicon with a surface oxide layer. The applied photosensitive film is dried and then exposed to ultraviolet light or other radiation in the desired geometrical pattern through a photomask. After exposure, the wafer is soaked in a wet solution that develops the polymer film by only leaving the portions of its material which form an image of the exposed geometrical pattern. Subsequently, surface areas of the oxide layer of the wafer not covered and thus protected by the exposed pattern of polymer film remaining on the wafer are etched away. The etching step thus transfers the exposed geometric pattern of the polymer film to the underlying wafer surface. Finally, the remaining polymer film is removed.

One extremely important requirement in semiconductor fabrication is cleanliness for ensuring ultimate reliability of the fabricated device. Highly sophisticated cleaning steps are interspersed between the aforementioned major processing stages for that purpose. It is critical that the semiconductor wafer not be contaminated by contact with the external environment nor by impure materials and solvents used in the various processing stages.

As a consequence of the paramount importance of cleanliness in the fabricating process to manufacturing yield and device reliability, there is a continuing search for alternative approaches which will reduce exposure to potential sources of contamination. One alternative general approach is to eliminate the use of a separate mask and instead utilize ion implantation to create a mask in the material of the semiconductor itself for employment in the subsequent etching step. This general approach is exemplified in the prior art by Taylor et al U.S. Pat. No. 4,377,437, Mashiko et al U.S. Pat. No. 4,377,734, Komatsu et al U.S. Pat. No. 4,438,556, Rensch et al U.S. Pat. No. 4,569,124, Robb U.S. Pat. No. 4,601,778 and Aklufi U.S. Pat. No. 4,450,041.

The respective U.S. Pat. Nos. 4,377,437 and 4,377,734 to Taylor et al and Mashiko et al both employ the implantation of a metal into a substrate surface. Subsequent reaction of that metal with an oxygen-containing or halogen-containing plasma produces a relatively nonreactive oxide or halide of the implanted metal. The reduction in the etching rate of the resulting chemically modified surface is the origin of the difference in etching rates between implanted and non-implanted surface regions. Similarly, the U.S. Pat. No. 4,601,778 to Robb involves an oxygen or hydrogen plasma to chemically modify the plasma-exposed surface and produce a difference in etching rates between the chemically modified surface regions and the unmodified regions that were protected from exposure to the reactive oxygen or hydrogen plasmas.

The U.S. Pat. No. 4,438,556 to Komatsu et al requires the implantation of enough ions to produce a metallic barrier layer in the semiconductor surface region. This metallic barrier layer etches at a slower rate than the unimplanted semiconductor. Thus, this process, like the processes of Taylor et al, Mashiko et al and Robb patents described above, relies on a change in the chemical composition of the implanted region to reduce the etching rate.

The U.S. Pat. No. 4,569,124 to Rensch et al employs ion-beam mixing at a metal/semiconductor interface or a metal/insulator interface to produce a material in the interfacial region which has a different chemical composition and, consequently, a different chemical etching rate than the original materials. This process requires the application of a metal layer to the substrate surface prior to ion bombardment.

The U.S. Pat. No. 4,450,041 to Aklufi involves the selective suppression of etching of an ion-bombarded region of a semiconductor by requiring a phase change of the surface layer. Specifically, the surface layer is converted from an amorphous semiconductor material into a crystalline material which etches more slowly than the original amorphous phase.

SUMMARY OF THE INVENTION

The present invention takes the general approach of the above-cited U.S. patents to eliminate the use of a separate mask and instead utilize ion implantation to create a mask in the material of the semiconductor itself for employment in the subsequent etching step. However, unlike the prior patents, the present invention relates to a photochemical etching process which uniquely uses ion-bombardment-induced damage in selected regions of a semiconductor material to suppress the etching of those regions by increasing the rate of recombination of free electronic carriers in such regions.

One fundamental characteristic of the photochemical etching process of the present invention is the use of light to generate the free electronic carriers that are required for the carrier-driven photochemical etching process. A second fundamental characteristic of this process is the modification of the electronic properties of a semiconductor through the creation of damage sites by ion implantation. This modification of the electronic properties of a semiconductor leads to the reduction of the number of free electronic carriers at the damage sites through enhanced free-carrier recombination rates. This reduction in free carriers thereby reduces the rate of the photochemical etching process at the damage sites.

None of the six patents discussed earlier embody these fundamental characteristics of the photochemical etching process of the present invention since they embody neither light-driven chemical etching processes that require free electronic carriers nor do they employ the modification of the electronic properties of a semiconductor to suppress etching of the ion-implanted regions of a semiconductor surface. Instead, the first five patents rely on a change in the chemical composition of the ion-bombarded surface region to produce selective etching. The sixth or last patent relies on an ion-bombardment-induced phase transition.

The photochemical etching process of the present invention does not require chemical modification of the semiconductor to produce a material with a chemical composition that is more etch resistant. Instead, the process relies solely on the creation of defects in the solid that can increase the rate of recombination of light-generated free electronic carriers. Selective etching results from the change in the electronic properties produced by ion bombardment rather than from an ion-bombardment-induced change in the chemical composition of the surface. Neither does the photochemical etching process of the present invention require the presence of an amorphous semiconductor surface layer or a phase change of the surface layer. Instead, the process is applicable to crystalline semiconductor materials, and, thus, to a wide range of structurally tailored semiconductors, such as superlattices, in which the crystalline integrity of the substrate must not be degraded by an etching process.

The photochemical etching process of the present invention comprises the steps of: (a) selective ion implanting; (b) photochemical dry etching; and (c) thermal annealing, in that order, for high yield semiconductor fabrication. The process of the present invention by involving ion-implanting and dry etching followed by thermal annealing has the potential to reduce the number of separate masking and mask-removal steps inherent in modern conventional semiconductor fabrication, thereby allowing for self-aligned structures with the associated advantages of eliminating registration errors, allowing for more densely packed, higher performance devices and circuits, and improving manufacturing yields.

Further, because the present invention employs a dry, i.e., gas-phase, etchant it would be possible to perform all process steps of the present invention in a single vacuum chamber or a series of connected chambers without exposing the semiconductor wafer to possible contamination from an environment external to the process chamber or chambers. This is one aspect of the process of the present invention which makes the invention significantly different from and better than a process of wet photoelectrochemical etching reported by A. Yamamoto et al, in an article entitled "Anodic Dissolution of N-Type Gallium Arsenide under Illumination", in *J. Electrochem. Soc.*, Vol. 122, pages 260–267 (Feb. 1975). In addition to these inherent advantages of the dry etching over wet etching processes, this invention differs from this prior process in not requiring the attachment of any external electrical voltage source. This prior process is based on a photoelectrochemical reaction and therefore requires the attachment of wires to the sample to be etched. This is a serious detriment to the application of the prior process to actual device manufacture since the attachment of electrode wires prior to etching and their removal after etching increases the number of process steps required to fabricate a device and prevents the performance of several process steps within a single process chamber or series of connected process chambers.

These and other advantages and attainments of the present invention will become apparent to those skilled in the art upon a reading of the following detailed description when taken in conjunction with the drawing wherein there is shown and described an illustrative embodiment of the invention.

BRIEF DESCRIPTION OF THE DRAWING

In the course of the following detailed description, reference will be made to the attached drawing in which the single FIGURE is a flow chart illustrating the steps in the electronic-carrier-controlled photochemical etching process of the present invention.

DETAILED DESCRIPTION OF THE INVENTION

Referring now to the single FIGURE of the drawing, there is shown a flow chart depicting the steps of an electronic-carrier-controlled photochemical etching process of the present invention for carrying out patterning and selective removing of material in semiconductor device fabrication. The process makes use of the damage produced by selective ion implantation to pattern a semiconductor substrate using dry fabrication techniques by selectively suppressing the chemical reactivity of the ion-damaged region relative to the chemical reactivity of the surrounding unimplanted, undamaged region.

More particularly, the photochemical etching process of the present invention comprises the steps of: (a) selective ion implanting; (b) photochemical dry etching; and (c) thermal annealing, in that order. Each of these steps in isolation or by itself is conventional; however, it is the particular combination of them in this sequence for achieving patterning and selective removing of semiconductor material that was unknown heretofore.

Conventionally, ion implantation per se is widely used in the controlled doping of semiconductor material, as an alternative to doping during natural growth or to doping by diffusion at elevated temperatures. Also, it is known that ion implantation introduces radiation damage which can be overcome by heating or thermal annealing the semiconductor material to sufficiently high temperatures. Specifically, the two effects of ion bombardment which occur during standard semiconductor ion implantation processes are (1) the creation of many lattice defects which increase the rate of recombination of electrons and holes and (2) the introduction of traps that reduce free carrier density. Recombination can be increased to such an extent that the maximum free-carrier density in the ion-bombarded region of a semiconductor can be reduced to intrinsic levels unless the semiconductor is thermally annealed to remove the recombination-mediating defects.

Recently, observation of photochemical dry etching reaction in a III-V semiconductor material was reported by C. I. H. Ashby, in an article entitled "Photochemical dry etching of GaAs", in *Appl. Phys. Lett.*, Vol. 45(8), pages 892–894 (Oct. 15, 1984). Also, more recently, observation of doping level-selective photochemical dry etching reaction in semiconductor materials was reported by C. I. H., in an article entitled "Doping level selective photochemical dry etching of GaAs", in *Appl. Phys. Lett.*, Vol. 46(8), pages 752–754 (Apr. 15, 1985), and observation of composition-selective photochemical dry etching reaction in semiconductor materials was reported by C. I. H. Ashby et al, in an article entitled "Composition-selective photochemical etching of compound semiconductors", in *Appl. Phys. Lett.*, Vol. 47(1), pages 62-63 (July 1, 1985). From these observations, it was concluded that photochemical dry etching reaction which requires direct participation of photogenerated carriers in the chemical reaction is sensitive to the electronic properties of the semiconductor. For such solid-excitation-based dry etching reaction, the balance between reaction and carrier recombination determines the practical utility of a particular reaction for device fabrication.

The photochemical etching process of the present invention uses these properties of ion-bombarded semiconductors and solid-excitation-based photochemical dry etching reactions in a unique sequence to permit spatially selective etching following ion-implantation patterning of a semiconductor surface. In this process, either a surface semiconductor layer of the appropriate doping level is grown for the structure and then selectively implanted in the regions thereof where etching is not desired or the semiconductor surface is ion-implanted to the dopant concentration required for the desired electronic properties of the final device.

However, at this point in the process (i.e. after the ion implanting step), the standard conventional thermal annealing step is not performed. Instead, while the implanted regions are still highly defected, the semiconductor is etched using the per se conventional solid-excitation-based photochemical dry etching reaction. The specific reaction used for etching is dictated by the particular semiconductor materials employed in the device. The much higher recombination rate in the ion-implantation-damaged region results in a much lower etching rate in the implanted regions and for the material immediately below them than in the unimplanted regions.

After the photochemical dry etching step is concluded, the ion-implanted regions will remain as raised structures. The semiconductor can now be thermally annealed to remove the damage and restore electrical conductivity and/or activate the implanted species.

The photochemical etching process of the present invention should be applicable to any type of semiconductor material, including silicon, III-V and II-VI compound semiconductors, and to both p-doped and n-doped materials. It has the additional potential of material composition and dopant-type selectivity inherent in solid-excitation-based photochemical etching reactions. The process of the present invention could be advantageously employed to fabricate such devices as discrete and integrated solid-state lasers, heterojunction bipolar transistors and integrated circuits, and both homojunction and heterojunction field effect transistors. Examples One embodiment of the electronic-carrier-controlled photochemical etching process of the present invention has been demonstrated in the selective etching of n-doped GaAs (mid-$10^{18}$/cm$^3$ Si) by Cl atoms under irradiation with 514.5-nm photons. Appropriate reaction conditions of Cl-atom flux and photon flux were established to etch 0.39 micrometers of undamaged GaAs during a 30-minute reaction time. Under identical reaction conditions, GaAs implanted with $10^{14}$/cm$^2$ fluence of 40-keV B ions etched only to a depth of 0.08 micrometers. This represents almost a five-to-one etch rate between the undamaged and the damaged samples. Another embodiment of the electronic-carrier-controlled photochemical etching process of the present invention has been demonstrated in the selective etching of n-doped GaAs ($10^{17}$/cm$^3$ Si) by Cl atoms under irradiation with 514.5-nm photons. Appropriate reaction conditions of Cl-atom flux and photon flux were established to etch 0.50 micrometers of undamaged GaAs during a 30-minute reaction time. Under identical reaction conditions, GaAs implanted with $10^{14}$/cm$^2$ fluence of 40-keV B ions etched only to a depth of less than 100 angstroms. This represents almost a fifty-to-one etch rate between the undamaged and the damaged samples. The distance within the semiconductor through which the photogenerated carriers must diffuse prior to producing reaction at the surface increases as the wavelength of the exciting photons increases. Consequently, using lower energy, longer wavelength photons than 514.5 nm should produce an even greater difference in etch rates between damaged and undamaged material since more opportunities for recombination at damage sites exist when carriers must diffuse farther.

It is thought that the present invention and many of its attendant advantages will be understood from the foregoing description and it will be apparent that various changes may be made in the form, construction and arrangement thereof without departing from the spirit and scope of the invention or sacrificing all of its material advantages, the form hereinbefore described being merely a preferred or exemplary embodiment thereof.

We claim:

1. An electronic-carrier-controlled photochemical etching process for carrying out patterning and selective removing of material in semiconductor device fabrication, said photochemical etching process comprising the steps of:
   (a) selective ion implanting for defining a damaged region in the semiconductor material in a desired pattern;
   (b) photochemical dry etching the semiconductor material for removing material from non-damaged regions thereof; and
   (c) thermal annealing non-removed semiconductor material.

2. The process as recited in claim 1, wherein said etching includes applying a gas-phase etchant.

3. The process as recited in claim 2, wherein said etching produces a solid-excitation-based photochemical reaction.

4. The process as recited in claim 1, wherein said selective ion implanting produces damage in the region of the semiconductor material in the desired pattern, but leaves undamaged the remainder of the region of the material not implanted.

5. The process as recited in claim 1, wherein during said photochemical dry etching the rate of recombination of electrons and holes is increased in the damaged region of the pattern compared to undamaged region.

6. The process as recited in claim 1, wherein during said photochemical dry etching the material in the undamaged region of the semiconductor is removed substantially faster than in the damaged region representing the pattern, leaving the ion-implanted, damaged region as raised surface structure on the semiconductor material.

7. The process as recited in claim 1, wherein said thermal annealing restores the electrical conductivity of the damaged region of the semiconductor material.

8. An electronic-carrier-controlled photochemical etching process for carrying out patterning and selective removing of material in semiconductor device fabrication, said photochemical etching process comprising the steps of:
   (a) first, selective ion implanting for defining a damaged region in the semiconductor material in a desired pattern;
   (b) second, photochemical dry etching with a gas-phase etchant to produce a solid-excitation-based photochemical reaction in the semiconductor material for removing material from non-damaged region thereof; and
   (c) third, thermal annealing non-removed semiconductor material.

9. The process as recited in claim 8, wherein said selective ion implanting produces damage in the region of the semiconductor material in the desired pattern, but leaves undamaged the remainder of the region of the material not implanted.

10. The process as recited in claim 8, wherein during said photochemical dry etching the rate of recombination of electrons and holes is increased in the damaged region of the pattern compared to undamaged region.

11. The process as recited in claim 8, wherein during said photochemical dry etching the material in the undamaged region of the semiconductor is removed substantially faster than in the damaged region representing the pattern, leaving the ion-implanted, damaged region as raised surface structure on the semiconductor material.

12. The process as recited in claim 8, wherein said thermal annealing restores the electrical conductivity of the damaged region of the semiconductor material.

13. An electronic-carrier-controlled photochemical etching process for carrying out patterning and selective removing of material in semiconductor device fabrication, said photochemical etching process comprising the steps of:
   (a) first, selective ion implanting for defining a damaged region in the semiconductor material in a desired pattern, said selective ion implanting producing damage in said region of the semiconductor material in the desired pattern, but leaving undamaged the remainder of the region of the material not implanted;
   (b) second, photochemical dry etching with a gas-phase etchant to produce a solid-excitation-based photochemical reaction in the semiconductor material for removing material from undamaged region thereof substantially faster than in the damaged region thereof representing the pattern, leaving the ion-implanted, damaged region as raised surface structure on the semiconductor material; and
   (c) third, thermal annealing non-removed semiconductor material for restoring the electrical properties of the damaged region of the semiconductor material.

14. The process as recited in claim 13, wherein during said photochemical dry etching the rate of recombination of electrons and holes is increased in the damaged regions of the pattern compared to undamaged regions.

* * * * *